United States Patent [19]

Thiele

[11] Patent Number: 4,651,251

[45] Date of Patent: Mar. 17, 1987

[54] PROTECTIVE CIRCUITRY FOR A THYRISTOR

[75] Inventor: Gerd Thiele, Erlangen, Fed. Rep. of Germany

[73] Assignee: Siemens Aktiengesellschaft, Berlin and Munich, Fed. Rep. of Germany

[21] Appl. No.: 730,723

[22] Filed: May 6, 1985

[30] Foreign Application Priority Data

May 10, 1984 [DE] Fed. Rep. of Germany ....... 3417359

[51] Int. Cl.$^4$ ........................ H03K 17/73; H02H 7/12
[52] U.S. Cl. .................................. 361/91; 307/252 J; 361/111; 363/54; 363/68
[58] Field of Search ............ 361/91, 111; 307/252 R, 307/252 J, 252 N; 363/54, 68

[56] References Cited

U.S. PATENT DOCUMENTS

| | | | |
|---|---|---|---|
| 3,938,026 | 2/1976 | Hoffman et al. ................ | 307/252 R |
| 4,367,418 | 1/1983 | Faust et al. ............................ | 363/68 |
| 4,473,858 | 9/1984 | Thiele ................................... | 361/91 |

FOREIGN PATENT DOCUMENTS 2444910  4/1976  Fed. Rep. of Germany .

OTHER PUBLICATIONS

Design of Water-Cooled Thyristor Valve Groups for Extension of Manitoba Hydro HVDC System by Beriger, Etter, Hengsberger and Thiele; Cigre Report No. 14–05 given at the International Conference on Large High Voltage Electric Systems at Paris in 1976.

Primary Examiner—A. D. Pellinen
Assistant Examiner—Jeffrey A. Gaffin
Attorney, Agent, or Firm—Volker R. Ulbrich

[57] ABSTRACT

A protection circuit for use with a thyristor having several break over diode, BOD, elements is connected between the anode and the gate of a thyristor providing static and dynamic overvoltage protection. With the exception of the BOD element connected to the gate, all the BOD elements have RC circuits connected in parallel, whose respective resistance and capacitance values are essentially identical. The BOD element connected to the gate and the cathode-gate portion of the thyristor has an additional RC circuit connected in parallel, whose resistance value is smaller or the same and whose capacitance value is smaller than the respective resistance and capacity values of the other RC circuits. Preferably, in this last RC circuit the resistance value is very small in contrast to the resistance values of the other RC circuits, and the capacitance value is negligible. In this preferred embodiment, the static actuation voltage is determined by the BOD elements not directly connected to the gate, and the dynamic actuation characteristic is determined by an equivalent series RC circuit which is determined by the capacitances of all the RC circuits and by the resistance, which is connected in parallel to the series connection of the BOD element connected to the gate and the thyristor gate-cathode portion.

7 Claims, 1 Drawing Figure

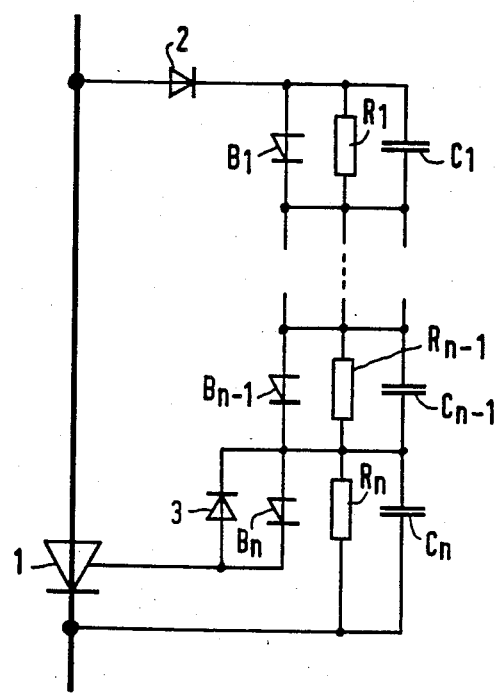

PROTECTIVE CIRCUITRY FOR A THYRISTOR

BACKGROUND OF THE INVENTION

This invention relates to the field of protective circuitry for a thyristor and more particularly to protection from undesired breakover of the thyristor. This protection is provided by a minimum of two break over diodes, BOD, elements connected in series, whose combined threshold voltages are smaller than the thyristor's off-state break over voltage and which, having the same polarity as the thyristor, are connected between the thyristor's anode and its gate.

The undesired ignition of thyristors can occur if the anode-cathode voltage either exceeds the off-state break over voltage or if this voltage increases with a very short rise time (e.g., 2 to 3 microseconds). Such undesired ignitions generally occur in an uncontrolled fashion at a localized random spot along the cathode junction surface with the possibility of leading to a destruction of the thyristor due to the high dissipation losses encountered in such a switch-on.

The undesired ignition is transformed into a desired self-ignition by a corresponding control pulse at the thyristor gate. This prevents destruction of the thyristor in the case of voltages exceeding the rated breakover voltage or the critical off-state voltage increase rate.

One type of protection circuit is known from DE-OS No. 24 44 910, which operates both statically as well as dynamically, i.e., which provides protection both against exceeding the off-state break over voltage as well as exceeding permissible dv/dt values. It is, however, a more complex design using transistor circuitry.

Another type of break over diode protective circuit is known from the Cigre report 14-05/19, 1976. It is installed in the Canadian high-voltage d.c. transmission system (HVDC) designated as "Nelson River." In said circuit the protection against break over ignition of the thyristors when exceeding the off-state break over voltage is provided using high-voltage sweep diodes, also called BOD elements, which are connected to the anode and gate of the thyristor to be protected. In this arrangement, several BOD elements are connected in series with parallel-connected high-ohmic resistances for voltage stabilization. The advantage of this protective circuitry with BOD elements is that when exceeding the off-state break over voltage or threshold voltage of the BOD elements, a precise control pulse is transmitted to the thyristor, whereby additionally during the ignition delay time, of the BOD elements and particularly of the thyristors to be protected, in conjunction with the protective reactance coil or the transformer leakage inductance, a voltage limitation is established. An ignition in the event of exceeding the permissible dv/dt values for the thyristor is not, however, initiated, that is to say, the Nelson River protective circuitry does not operate in a dynamic fashion. Accordingly, it will be appreciated that it would be highly desirable to provide a protection circuit with the simplicity and performance of the "Nelson River" protective circuit yet has the dynamic performance against fast rise time voltage increases.

It is an object of this invention to design a protective circuit having the simplicity and speed of the break over diode type, which also operates dynamically, i.e., initiates a protective ignition when exceeding the permissible dv/dt values.

SUMMARY OF THE INVENTION

Briefly stated in accordance with one aspect of the invention, the foregoing objects are achieved by providing a BOD protection circuit having all the BOD elements, with the exception of that BOD element connected to the gate, connected in parallel to an RC element, whereby the respective resistance and capacitance values of these RC elements are essentially equal, and by the BOD element connected to the gate and the cathode-gate section of the thyristor also having an additional RC circuit connected in parallel, whose capacitance value is smaller and whose resistance value is the same or less than the corresponding resistance and capacitance value of the other RC circuits.

BRIEF DESCRIPTION OF THE DRAWING

While the specification concludes with claims particularly pointing out and distinctly claiming the subject matter which is regarded as the invention, it is believed that the invention will be better understood from the following description of the preferred embodiment taken in conjunction with the accompanying drawing which is an electrical schematic diagram.

DETAILED DESCRIPTION OF THE PREFERRED EMBODIMENT

The diagram shows a thyristor 1 whose anode is connected to its gate by a blocking diode 2 and n BOD elements $B_1$ to $B_n$. Each BOD element $B_1$ to $B_{n-1}$ not directly connected to the gate is connected in parallel to an RC circuit, each having a respective resistor, $R_1$ to $R_{n-1}$ and capacitor, $C_1$ to $C_{n-1}$. All resistors, $R_1$ to $R_{n-1}$ possess the same resistance value R, and all capacitors $C_1$ to $C_{n-1}$ possess the same capacitance value C. A further RC circuit $R_n$ and $C_n$ is connected in parallel to the BOD element $B_n$ directly connected to the gate of thyristor 1 and the cathode-gate portion of thyristor 1. In addition, a recovery diode 3 is connected antiparallel to the BOD element $B_n$ directly connected to the gate of thyristor 1.

In order to understand the way in which the protective circuit operates, consider the voltage $v_n(t)$ as it appears across the RC circuit with resistance $R_n$ and $C_n$ with thyristor 1 blocked.

This voltage is defined as follows equation (1):

$$v_n(t) = S \frac{R_n}{(n-1)\cdot R + R_n} \left\{ t + \frac{(n-1)\cdot R}{(n-1)\cdot R + R_n} (\tau - \tau_n) \cdot \left(1 - e^{-\frac{t}{\tau_r}}\right)\right\}$$

with: $\tau = R \cdot C$
$\tau_n = R_n \cdot C_n$
$\tau_r = \frac{(n-1)\cdot R \cdot R_n}{(n-1)\cdot R + R_n} \cdot \left(\frac{C}{n-1} + C_n\right)$ wherein S represents the off state voltage rate of increase which is approximately determined by the system's capacitance and its discharge current. If equation (1) is simplified by $R_n = R$, you then have:

$$v_n(t) = \frac{S}{n} \cdot \left\{ t + \frac{n-1}{n} \cdot (\tau - \tau_n) \cdot \left(1 - e^{-\frac{t}{\tau_r}}\right) \right\} \quad \text{Equation (2)}$$

with $$\tau_r = \frac{n-1}{n} \cdot R \cdot \left(\frac{C}{n-1} + C_n\right)$$

The derivative of this voltage with respect to time is defined as follows:

$$\frac{dv_n}{dt} = \frac{S}{n} \cdot \left\{ 1 + \frac{(n-1)(C-C_n)}{C+(n-1)\cdot C_n} e^{-\frac{t}{\tau_r}} \right\} \quad \text{Equation (3)}$$

For t=0 one then obtains:

$$\left(\frac{dv_n}{dt}\right)_{t=0} = \frac{S}{n} \cdot \frac{n \cdot C}{C+(n-1)\cdot C_n} \quad \text{Equation (4)}$$

with $$\left(\frac{dv_n}{dt}\right)_{t=0} = \frac{S}{n} \text{ for } C_n = C,$$

$$\left(\frac{dv_n}{dt}\right)_{t=0} > \frac{S}{n} \text{ for } C_n < C,$$

$$\left(\frac{dv_n}{dt}\right)_{t=0} < \frac{S}{n} \text{ for } C_n > C.$$

This means that for $C_n$ greater than C the voltage $v_n(t)$ increases more steeply, thus releasing a dynamic protective ignition earlier than would be the case for the static actuation threshold S/n. Taking into account the system capacitance and its discharge current, one can determine the magnitude of the capacitance $C_n$ so that a dynamic protection ignition for $$\frac{dv_n}{dt} > 1 \frac{kV}{\mu S}$$

is specifically initiated with an adequately large ignition pulse. The static actuation threshold continues to be determined by the n BOD elements connected in series.

In a further simplification, one assumes for equation (1) $R_n << R$, $C >> C_n \to 0$). This results in:

$$v_n(t) = s \cdot \frac{R_n \cdot C}{n-1} \cdot \left(1 - e^{-\frac{t(n-1)}{R_n \cdot C}}\right) \quad \text{Equation (5)}$$

and $$\frac{dv_n}{dt} = S \cdot e^{-\frac{t(n-1)}{R_n \cdot C}} \quad \text{Equation (6)}$$

With this rating the n-th BOD element $B_n$ along with the series RC circuit formed by the capacitor $C_1$ to $C_{n-1}$ and the resistance $R_n$ is responsible for the dv/dt-dependent ignition, whereby the capacitance $C_1$ to $C_{n-1}$ generate a dynamic shunt connection to resistances $R_1$ to $R_{n-1}$ and along with $R_n$ determine the dynamic actuation characteristic with the time constant $R_n \cdot (C/(n-1))$. In addition, the capacitors $C_1$ to $C_{n-1}$ carry the required load to ignite the thyristor after actuation of the BOD elements $B_n$. Experimental observations of the arrangements indicate that the number of BOD elements $B_1$ to $B_{n-1}$ connected in series to assure a good dynamic response characteristic should be approximately 4 to 5.

The remaining BOD elements $B_1$ to $B_{n-1}$, in conjunction with the precision of their parallel stabilizing resistances $R_1$ to $R_n$ determine the static response voltage.

It was found that the circuit realization with $R_n << R$ and $C_n \approx 0$ in its static and dynamic actuation behavior is substantially more advantageous than the initially analyzed circuit realization with $R_n = R$.

When igniting thyristor 1, the voltage in capacitor $C_1$ to $C_{n-1}$ can drive a current backwards via the blocking diode 2 and the BOD element $B_n$ for a brief period. This current depends upon the blocking delay load of the blocking diode 2 and could under given circumstances disrupt the BOD element $B_n$. By means of diode 3 connected antiparallel to the BOD element $B_n$, this danger is eliminated.

In the protective circuit defined by this invention, the actuation of the off state voltage rate of increase depends on a capacitively adjusted voltage divider connected in parallel to the circuit of series BOD elements.

Preferably very low resistance and negligible capacitance values are selected.

By this rating one produces a separation of the tasks to the extent that the BOD element directly connected to the thyristor gate assumes the ignition dependent on dv/dt along with a series RC circuit, while the other BOD elements are responsible for the static actuation. Thereby the series RC circuit is formed by the capacitors of the parallel RC circuits along with the resistance which bridges the BOD element and, in addition, the cathode-gate section of the thyristor.

As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured as Letters Patent of the United States is:

1. A protective circuit for use with a thyristor comprising:
    a plurality of essentially identical breakover diodes (BOD's) having threshold voltages smaller than the off state breakover voltage of the thyristor, connected serially anode to cathode in parallel with the thyristor gate and anode with the final BOD cathode connected to the thyristor gate;
    a plurality of essentially identical resistors having one connected in parallel with each said BOD respectively except for the BOD directly connected to the thyristor gate;
    a plurality of essentially identical capacitors having one connected in parallel with each said BOD respectively except for the BOD directly connected to the thyristor gate;
    another resistor, having a value at most equal to the value of one of said plurality of resistors, connected from the anode of the BOD directly connected to the thyristor gate to the thyristor cathode; and another capacitor, having a value less than the value of one of said plurality of capacitors connected in parallel with said other resistor.

2. A protection circuit according to claim 1, wherein said other resistor has an ohmic value very much less than the value of one of said plurality of resistors; and said other capacitor is negligible relative to the value of one of said plurality of capacitors.

3. A protective circuit according to claim 1, further comprising a reverse diode connected antiparallel to the BOD directly connected to the gate of said thyristor.

4. A protective circuit according to claim 2, further comprising a reverse diode connected antiparallel to the BOD directly connected to the gate of said thyristor.

5. A protective circuit according to claim 1, further comprising a blocking diode connected between the thyristor anode and the plurality of serial connected BOD's.

6. A protective circuit according to claim 3, further comprising a blocking diode connected between the thyristor anode and the plurality of serial connected BOD's.

7. A protective circuit according to claim 4, further comprising a blocking diode connected between the thyristor anode and the plurality of serial connected BOD's.

* * * * *